(12) United States Patent
Teruuchi et al.

(10) Patent No.: US 12,424,424 B2
(45) Date of Patent: Sep. 23, 2025

(54) PLASMA MONITORING SYSTEM, PLASMA MONITORING METHOD, AND MONITORING DEVICE

(71) Applicant: Tokyo Electron Limited, Tokyo (JP)

(72) Inventors: Satoru Teruuchi, Miyagi (JP); Jun Hirose, Miyagi (JP); Kazuya Nagaseki, Miyagi (JP); Shinji Himori, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 140 days.

(21) Appl. No.: 18/515,220

(22) Filed: Nov. 20, 2023

(65) Prior Publication Data

US 2024/0096608 A1 Mar. 21, 2024

Related U.S. Application Data

(63) Continuation of application No. PCT/JP2022/020855, filed on May 19, 2022.

(30) Foreign Application Priority Data

May 26, 2021 (JP) ................. 2021-088516

(51) Int. Cl.
*H01J 37/32* (2006.01)
*G01N 21/68* (2006.01)
*H01L 21/67* (2006.01)

(52) U.S. Cl.
CPC ........ *H01J 37/32935* (2013.01); *G01N 21/68* (2013.01); *H01J 2237/2445* (2013.01); *H01J 2237/24585* (2013.01); *H01L 21/67253* (2013.01)

(58) Field of Classification Search
CPC ........ H01J 37/32935; H01J 2237/2445; H01J 2237/24585; H01J 37/32972; G01N 21/68; H01L 21/67253; H01L 21/3065; H05H 1/00; H05H 1/46; H05H 1/0037; G01J 3/443
See application file for complete search history.

(56) References Cited

U.S. PATENT DOCUMENTS

| 2016/0104606 A1* | 4/2016 | Park | H01J 37/32972 |
| | | | 315/111.21 |
| 2020/0058516 A1* | 2/2020 | Park | H01L 21/67069 |

FOREIGN PATENT DOCUMENTS

JP 2004-039952 A 2/2004

* cited by examiner

*Primary Examiner* — Tony Ko
(74) *Attorney, Agent, or Firm* — Studebaker Brackett PLLC

(57) ABSTRACT

A plasma monitoring system includes a monitoring device and a control device. The monitoring device is a device to be placed on a stage in the plasma processing apparatus. The monitoring device includes a plate-shaped base substrate, and a plurality of spectroscopes having optical axes facing upward on the base substrate, and being disposed apart from each other to acquire light emission intensities of the plasma. The control device acquires light emission intensity distribution data of the plasma in the plasma processing apparatus based on the light emission intensity acquired by each of the plurality of spectroscopes.

18 Claims, 8 Drawing Sheets

PLASMA MONITORING SYSTEM, PLASMA MONITORING METHOD, AND MONITORING DEVICE

CROSS-REFERENCE TO RELATED APPLICATIONS

This application is a continuation application of PCT Application No. PCT/JP2022/020855, filed on May 19, 2022, which claims the benefit of priority from Japanese Patent Application No. 2021-088516, filed on May 26, 2021. The entire contents of the above listed PCT and priority applications are incorporated herein by reference.

BACKGROUND

Field

Exemplary embodiments of the present disclosure relate to a plasma monitoring system, a plasma monitoring method, and a monitoring device.

Description of the Related Art

Japanese Unexamined Patent Application Publication No. 2004-39952 discloses a technique related to a plasma processing apparatus. This plasma processing apparatus includes a processing chamber in which plasma processing is performed, and an optical detector provided on an outside of the processing chamber via a detection window. The optical detector monitors a state of a plasma generated in the processing chamber.

SUMMARY

In one exemplary embodiment, there is provided a system for measuring a light emission intensity of a plasma generated in a plasma processing apparatus. This system includes a monitoring device and a control device. The monitoring device is a device to be placed on a stage in the plasma processing apparatus. The monitoring device includes a plate-shaped base substrate, and a plurality of spectroscopes having optical axes facing upward on the base substrate, and being disposed apart from each other to acquire light emission intensities of the plasma. The control device acquires light emission intensity distribution data of the plasma in the plasma processing apparatus based on the light emission intensity acquired by each of the plurality of spectroscopes.

DETAILED DESCRIPTION

Figure 1:
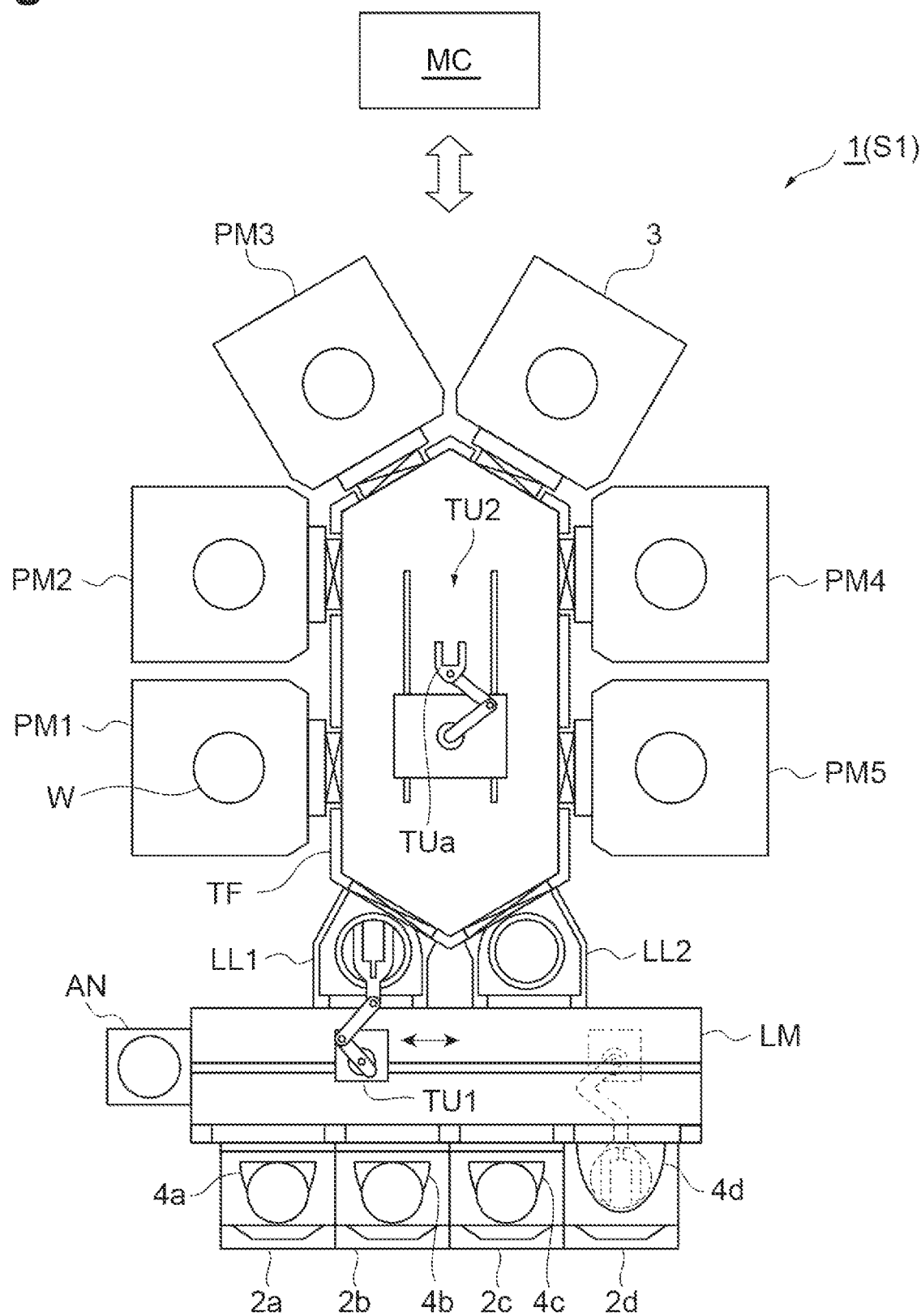
FIG. 1 is a diagram illustrating a processing system.

Hereinafter, various exemplary embodiments will be described.

In one exemplary embodiment, there is provided a system for measuring a light emission intensity of a plasma generated in a plasma processing apparatus. This system includes a monitoring device and a control device. The monitoring device is a device to be placed on a stage in the plasma processing apparatus. The monitoring device includes a plate-shaped base substrate, and a plurality of spectroscopes having optical axes facing upward on the base substrate, and being disposed apart from each other to acquire light emission intensities of the plasma. The control device acquires light emission intensity distribution data of the plasma in the plasma processing apparatus based on the light emission intensity acquired by each of the plurality of spectroscopes.

In another exemplary embodiment, there is provided a method of measuring a light emission intensity of a plasma generated in a plasma processing apparatus by using a monitoring device. The monitoring device includes a plate-shaped base substrate, and a plurality of spectroscopes having optical axes facing upward on the base substrate, and being disposed apart from each other. The method includes a step of placing the monitoring device on a stage in a chamber of the plasma processing apparatus. The method includes a step of generating a plasma in the chamber of the plasma processing apparatus. The method includes a step of acquiring light emission intensities of the plasma by the plurality of spectroscopes. The method includes a step of acquiring light emission intensity distribution data of the plasma in the plasma processing apparatus based on the light emission intensities acquired by the plurality of spectroscopes.

In the plasma monitoring system and the plasma monitoring method of the embodiments described above, the light emission intensity of the plasma generated in the plasma processing apparatus is acquired by the plurality of spectroscopes of the monitoring device placed on the stage. The plurality of spectroscopes are disposed apart from each other on the base substrate. Therefore, measurement regions for light in the respective spectroscopes are different from each other. That is, each of the spectroscopes can acquire the light emission intensity of the plasma in different regions in the plasma processing apparatus. Therefore, in the plasma monitoring system and the plasma monitoring method, it is possible to acquire a light emission intensity distribution of the plasma in the plasma processing apparatus from the light emission intensity of the plasma acquired by the plurality of spectroscopes.

In the one exemplary embodiment, the light emission intensity distribution data may be visible display data in which the light emission intensity acquired by each of the plurality of spectroscopes corresponding to each position of the plurality of spectroscopes in the monitoring device is displayed.

In the one exemplary embodiment, the measurement region of light of each of the plurality of spectroscopes in the plasma processing apparatus may not include an overlapping region.

With this configuration, it is possible to clearly separate the light emission intensity of the plasma generated in the plasma processing apparatus for each position.

Hereinafter, various embodiments will be described in detail with reference to the drawings. The same reference numerals will be given to the same or corresponding parts in each drawing.

A monitoring device 100 according to one exemplary embodiment forms a plasma monitoring system in cooperation with a processing system 1 that has a function as a semiconductor manufacturing apparatus S1. First, a processing system that includes a processing device for processing a workpiece and a transport device for transporting the workpiece to the processing device will be described. FIG. 1 is a diagram illustrating the processing system. The processing system 1 includes tables 2a to 2d, containers 4a to 4d, a loader module LM, an aligner AN, load lock modules LL1 and LL2, a process modules PM1 to PM5, a transfer module TF, and a controller MC. The number of tables 2a to 2d, the number of containers 4a to 4d, the number of load lock modules LL1 and LL2, and the number of process modules PM1 to PM5 are not limited, and any number equal to or greater than one can be used.

The tables 2a to 2d are arranged along one edge of the loader module LM. The containers 4a to 4d are mounted on the tables 2a to 2d, respectively. Each of the containers 4a to 4d is, for example, a container called a front opening unified pod (FOUP). Each of the containers 4a to 4d can be configured to accommodate a workpiece W. The workpiece W has a substantial disc shape like a wafer.

Inside the loader module LM, there is a chamber wall that defines a transport space in an atmospheric pressure state. A transport device TU1 is provided in this transport space. The transport device TU1 is, for example, an articulated robot, and is controlled by the controller MC. The transport device TU1 is configured to transport the workpiece W between the containers 4a to 4d and the aligner AN, between the aligner AN and the load lock modules LL1 to LL2, and between the load lock modules LL1 to LL2 and the containers 4a to 4d.

Figure 2:
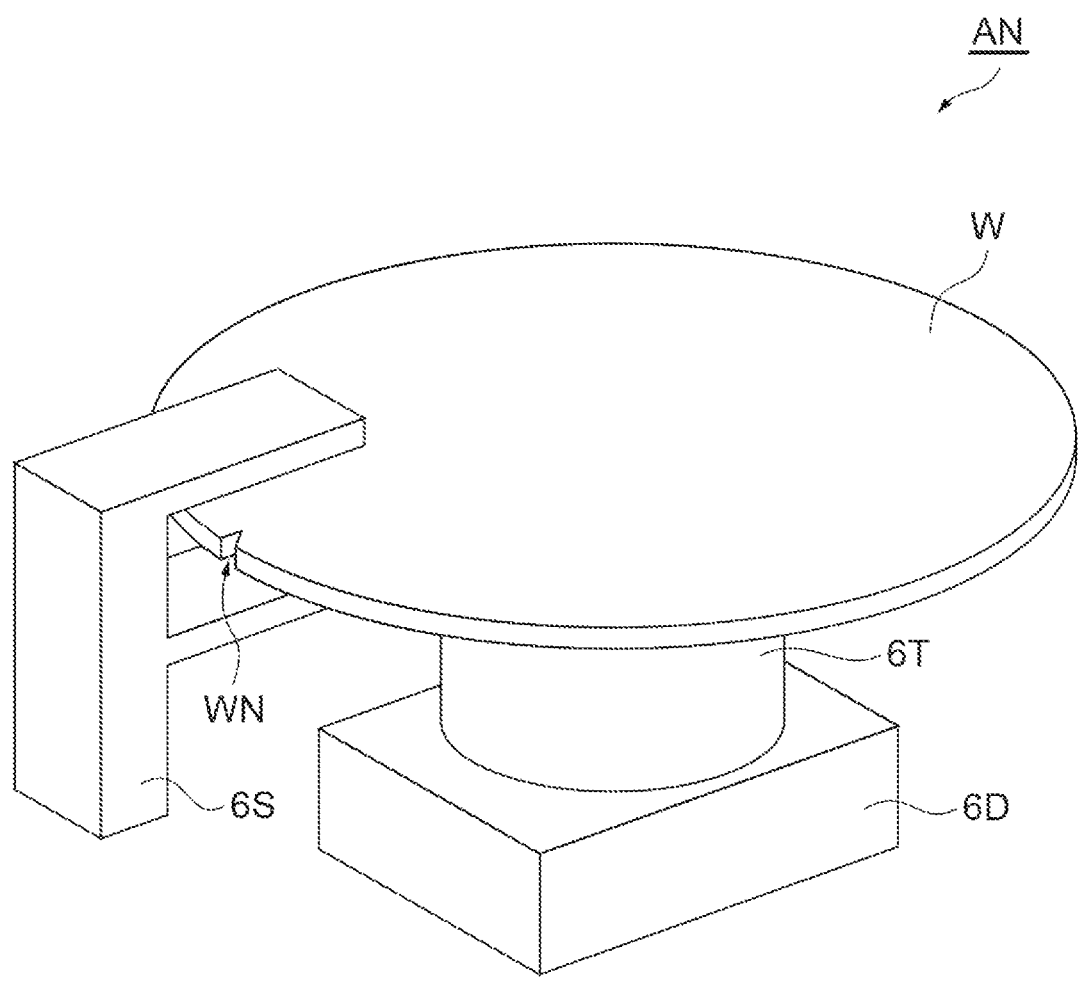
FIG. 2 is a perspective view illustrating an aligner.

The aligner AN is connected to the loader module LM. The aligner AN is configured to adjust a position of the workpiece W (calibrate the position). FIG. 2 is a perspective view illustrating an aligner. The aligner AN includes a support stand 6T, a drive device 6D, and a sensor 6S. The support stand 6T is a stand that can rotate around an axis extending in a vertical direction, and is configured to support the workpiece W on the support stand 6T. The support stand 6T is rotated by the drive device 6D. The drive device 6D is controlled by the controller MC. When the support stand 6T is rotated by power from the drive device 6D, the workpiece W placed on the support stand 6T is also rotated.

The sensor 6S is an optical sensor, and detects an edge of the workpiece W while the workpiece W is rotated. From the result of detecting the edge, the sensor 6S detects an amount of deviation of an angle position of a notch WN (or another marker) of the workpiece W with respect to a reference angle position and an amount of deviation of a center position of the workpiece W with respect to the reference position. The sensor 6S outputs the amount of deviation of the angle position of the notch WN and the amount of deviation of the center position of the workpiece W to the controller MC. The controller MC calculates an amount of rotation of the support stand 6T for correcting the angle position of the notch WN to the reference angle position based on the amount of deviation of the angle position of the notch WN. The controller MC controls the drive device 6D to rotate the support stand 6T as much as the amount of rotation. Therefore, the angle position of the notch WN can be corrected to the reference angle position. In addition, the controller MC may correct the angle position of the notch WN to any angle position. In addition, the controller MC controls a position of an end effector of the transport device TU1 when receiving the workpiece W from the aligner AN based on the amount of deviation of the center position of the workpiece W. Therefore, the center position of the workpiece W coincides with a predetermined position on the end effector of the transport device TU1.

Returning to FIG. 1, each of the load lock module LL1 and the load lock module LL2 is provided between the loader module LM and the transfer module TF. Each of the load lock module LL1 and the load lock module LL2 provides a preliminary decompression chamber.

The transfer module TF is airtightly connected to the load lock module LL1 and the load lock module LL2 via a gate valve. The transfer module TF provides a decompression chamber capable of reducing a pressure. A transport device TU2 is provided in this decompression chamber. The transport device TU2 is, for example, an articulated robot having a transport arm TUa, and is controlled by the controller MC. The transport device TU2 is configured to transport the workpiece W between the load lock modules LL1 to LL2 and the process modules PM1 to PM5, and between any two process modules of the process modules PM1 to PM5.

The process modules PM1 to PM5 are airtightly connected to the transfer module TF via the gate valve. Each of the process modules PM1 to PM5 is a processing device configured to perform dedicated processing such as plasma processing on the workpiece W.

A series of operations when the processing on the workpiece W is performed in the processing system 1 will be illustrated as follows. The transport device TU1 of the loader module LM takes out the workpiece W from any of the containers 4a to 4d, and transports the workpiece W to the aligner AN. Subsequently, the transport device TU1 takes out the workpiece W having the adjusted position from the aligner AN, and transports the workpiece W to one of the load lock module LL1 and the load lock module LL2. Next, one load lock module reduces the pressure in the preliminary decompression chamber to a predetermined pressure. Next, the transport device TU2 of the transfer module TF takes out the workpiece W from one of the load lock modules and transports the workpiece W to any of the process modules PM1 to PM5. Then, one or more process modules among the process modules PM1 to PM5 perform the processing on the workpiece W. Then, the transport device TU2 transports the processed workpiece W from the process module to one of the load lock module LL1 and the load lock module LL2. Next, the transport device TU1 transports the workpiece W from one of the load lock modules to any of the containers 4a to 4d.

This processing system 1 includes the controller MC as described above. The controller MC can be a computer including a processor, a storage device such as a memory, a display device, an input and output device, a communication device, and the like. The series of operations of the processing system 1 described above are realized by controlling each portion of the processing system 1 by the controller MC according to a program stored in the storage device.

Figure 3:
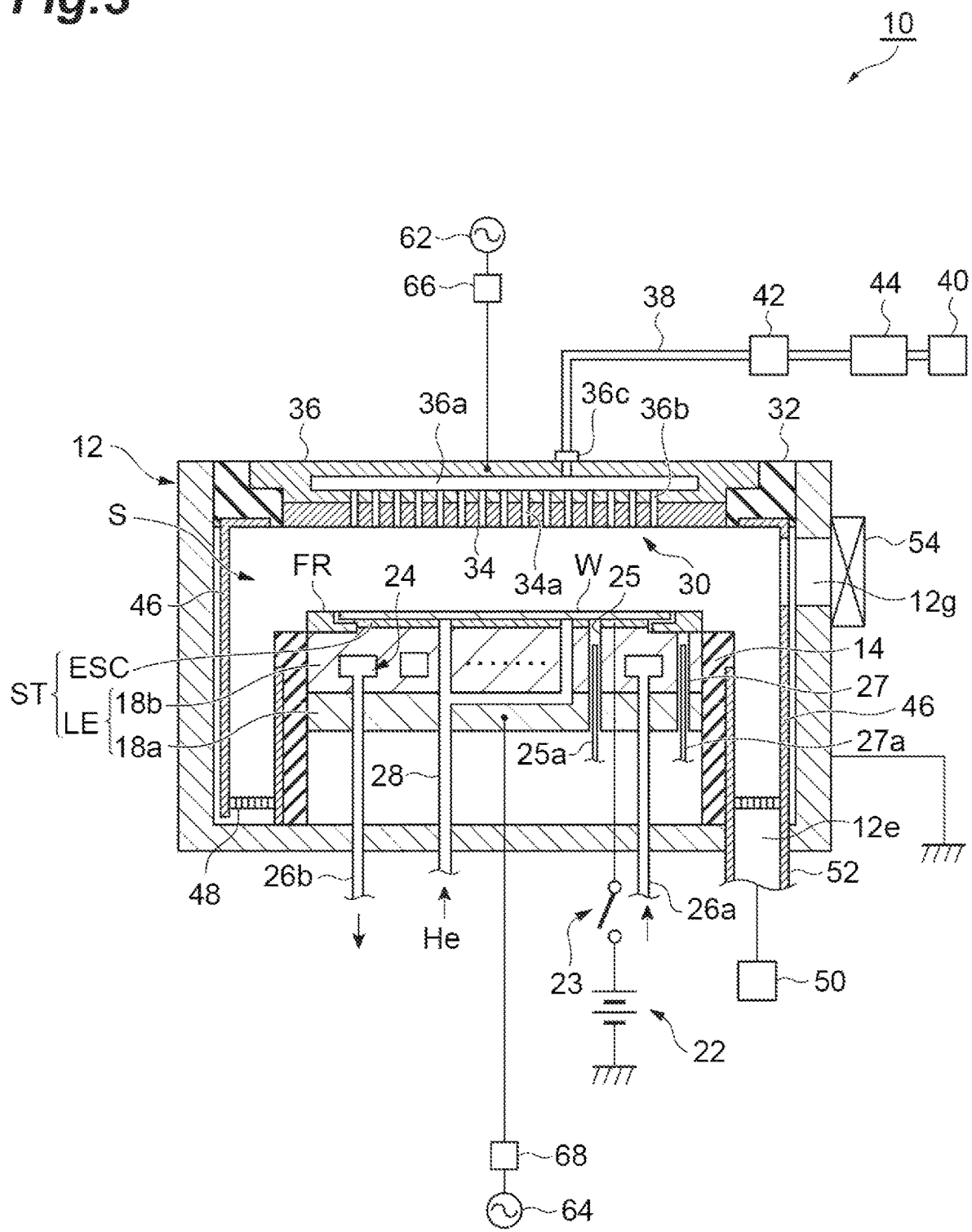
FIG. 3 is a diagram illustrating an example of a plasma processing apparatus.

FIG. 3 is a diagram illustrating an example of a plasma processing apparatus that can be adopted as any of the process modules PM1 to PM5. A plasma processing apparatus 10 illustrated in FIG. 3 is an electrostatic capacitance-coupling type plasma etching apparatus. The plasma processing apparatus 10 includes a chamber body 12 having a substantially cylindrical shape. The chamber body 12 is formed of, for example, aluminum, and an inner wall surface thereof can be anodized. This chamber body 12 is grounded for safety.

A support portion 14 having a substantially cylindrical shape is provided on a bottom portion of the chamber body 12. The support portion 14 is formed of, for example, an insulating material. The support portion 14 is provided in the chamber body 12, and extends upward from the bottom portion of the chamber body 12. In addition, a stage ST is provided in a chamber S provided by the chamber body 12. The stage ST is supported by the support portion 14.

The stage ST includes a lower electrode LE and an electrostatic chuck ESC. The lower electrode LE includes a first plate 18a and a second plate 18b.

The first plate 18a and the second plate 18b are formed of, for example, a metal such as aluminum, and have a substantial disc shape. The second plate 18b is provided on the first plate 18a, and is electrically connected to the first plate 18a.

The electrostatic chuck ESC is provided on the second plate 18b. The electrostatic chuck ESC has a structure in which an electrode, which is a conductive film, is disposed between a pair of insulating layers or insulating sheets, and has a substantial disc shape. A direct current power supply 22 is electrically connected to the electrode of the electrostatic chuck ESC via a switch 23. This electrostatic chuck ESC adsorbs the workpiece W by an electrostatic force such as a Coulomb force generated by a direct current voltage from the direct current power supply 22. Therefore, the electrostatic chuck ESC can hold the workpiece W.

A focus ring FR is provided on a peripheral edge portion of the second plate 18b. This focus ring FR is provided to surround the edge of the workpiece W and the electrostatic chuck ESC. The focus ring FR can be formed of any of various materials such as silicon, silicon carbide, and silicon oxide.

A refrigerant flow path 24 is provided inside the second plate 18b. The refrigerant flow path 24 forms a temperature control mechanism. Refrigerant is supplied to the refrigerant flow path 24 from a chiller unit provided outside the chamber body 12 via a pipe 26a. The refrigerant supplied to the refrigerant flow path 24 is returned to the chiller unit via a pipe 26b. In this manner, the refrigerant is circulated between the refrigerant flow path 24 and the chiller unit. A temperature of the workpiece W supported by the electrostatic chuck ESC is controlled by controlling a temperature of this refrigerant.

A plurality of (for example, three) through-holes 25 penetrating the stage ST are formed in the stage ST. The plurality of through-holes 25 are formed inside the electrostatic chuck ESC in a plan view. A lift pin 25a is inserted into each of the through-holes 25. In FIG. 3, one through-hole 25 into which one lift pin 25a is inserted is illustrated. The lift pin 25a is provided to be vertically movable in the through-hole 25. When the lift pin 25a rises, the workpiece W supported on the electrostatic chuck ESC rises.

In the stage ST, a plurality of (for example, three) through-holes 27 penetrating the stage ST (lower electrode LE) are formed at a position outside the electrostatic chuck ESC in a plan view. A lift pin 27a is inserted into each of the through-holes 27. In FIG. 3, one through-hole 27 into which one lift pin 27a is inserted is illustrated. The lift pin 27a is provided to be vertically movable in the through-hole 27. When the lift pin 27a rises, the focus ring FR supported on the second plate 18b rises.

In addition, a gas supply line 28 is provided in the plasma processing apparatus 10. The gas supply line 28 supplies a heat transfer gas from a heat transfer gas supply mechanism, such as a He gas, for example, to a place between an upper surface of the electrostatic chuck ESC and a back surface of the workpiece W.

In addition, the plasma processing apparatus 10 includes an upper electrode 30. The upper electrode 30 is disposed above the stage ST to face the stage ST. The upper electrode 30 is supported on the upper portion of the chamber body 12 via an insulating shielding member 32. The upper electrode 30 can include a top plate 34 and a support 36. The top plate 34 faces the chamber S, and the top plate 34 is provided with a plurality of gas discharge holes 34a. The top plate 34 can be formed of silicon or quartz. Alternatively, the top plate 34 can be configured by forming a plasma-resistant film such as yttrium oxide on a surface of an aluminum base material.

The support 36 detachably supports the top plate 34, and can be made of a conductive material such as aluminum, for example. The support 36 can have a water-cooled structure. A gas diffusion chamber 36a is provided inside the support 36. A plurality of gas flow holes 36b communicating with the gas discharge hole 34a extend downward from this gas diffusion chamber 36a. In addition, the support 36 is formed with a gas introduction port 36c for guiding processing gas into the gas diffusion chamber 36a, and a gas supply pipe 38 is connected to the gas introduction port 36c.

A gas source group 40 is connected to the gas supply pipe 38 via a valve group 42 and a flow rate controller group 44. The gas source group 40 includes a plurality of gas sources for a plurality of types of gases. The valve group 42 includes a plurality of valves, and the flow rate controller group 44 includes a plurality of flow rate controllers such as mass flow controllers. The plurality of gas sources of the gas source group 40 are connected to the gas supply pipe 38 via the corresponding valve of the valve group 42 and the corresponding flow rate controller of the flow rate controller group 44, respectively.

In addition, in the plasma processing apparatus 10, a depot shield 46 is detachably provided along an inner wall of the chamber body 12. The depot shield 46 is also provided on the outer periphery of the support portion 14. The depot shield 46 prevents etching by-products (depots) from adhering to the chamber body 12, and can be configured by coating an aluminum material with ceramics such as yttrium oxide.

An exhaust plate 48 is provided on a bottom portion side of the chamber body 12, and between the support portion 14 and the side wall of the chamber body 12. The exhaust plate 48 can be configured, for example, by coating an aluminum material with ceramics such as yttrium oxide. In the exhaust plate 48, a plurality of holes penetrating in a plate-thickness direction are formed. An exhaust port 12e is provided below the exhaust plate 48, and at the chamber body 12. An exhaust device 50 is connected to the exhaust port 12e via an exhaust pipe 52. The exhaust device 50 has a vacuum pump such as a pressure regulating valve and a turbo molecular pump, and can reduce the pressure of the space in the chamber body 12 to a desired degree of vacuum. In addition, a loading and unloading port 12g of the workpiece W is provided on the side wall of the chamber body 12, and the loading and unloading port 12g can be opened and closed by a gate valve 54.

In addition, the plasma processing apparatus 10 further includes a first radio frequency power supply 62 and a second radio frequency power supply 64. The first radio frequency power supply 62 is a power supply that generates a first radio frequency for plasma generation, and generates a radio frequency having a frequency of, for example, 27 to 100 MHz. The first radio frequency power supply 62 is connected to the upper electrode 30 via a matcher 66. The matcher 66 includes a circuit for matching an output impedance of the first radio frequency power supply 62 with an input impedance of a load side (upper electrode 30 side). The first radio frequency power supply 62 may be connected to the lower electrode LE via the matcher 66.

The second radio frequency power supply 64 is a power supply that generates a second radio frequency for drawing ions into the workpiece W, and generates, for example, a radio frequency in a range of 400 kHz to 13.56 MHz. The second radio frequency power supply 64 is connected to the lower electrode LE via a matcher 68. The matcher 68 includes a circuit for matching an output impedance of the second radio frequency power supply 64 with an input impedance of a load side (lower electrode LE side).

In the plasma processing apparatus 10, a gas from one or more gas sources selected from the plurality of gas sources is supplied to the chamber S. In addition, the pressure in the chamber S is set to a predetermined pressure by the exhaust device 50. Further, the gas in the chamber S is excited by the first radio frequency from the first radio frequency power supply 62. Therefore, a plasma is generated. Then, the workpiece W is processed by the generated active species. If necessary, ions may be drawn into the workpiece W by a bias based on the second radio frequency from the second radio frequency power supply 64.

Subsequently, the monitoring device 100 will be described. The monitoring device 100 acquires a light emission intensity of a plasma generated in the chamber S of the plasma processing apparatus 10. The monitoring device 100 of an example may be referred to as a jig since the monitoring device 100 is a device for disposing a spectroscope at a predetermined position on the stage ST in the process module PM (plasma processing apparatus 10).

Figure 4:
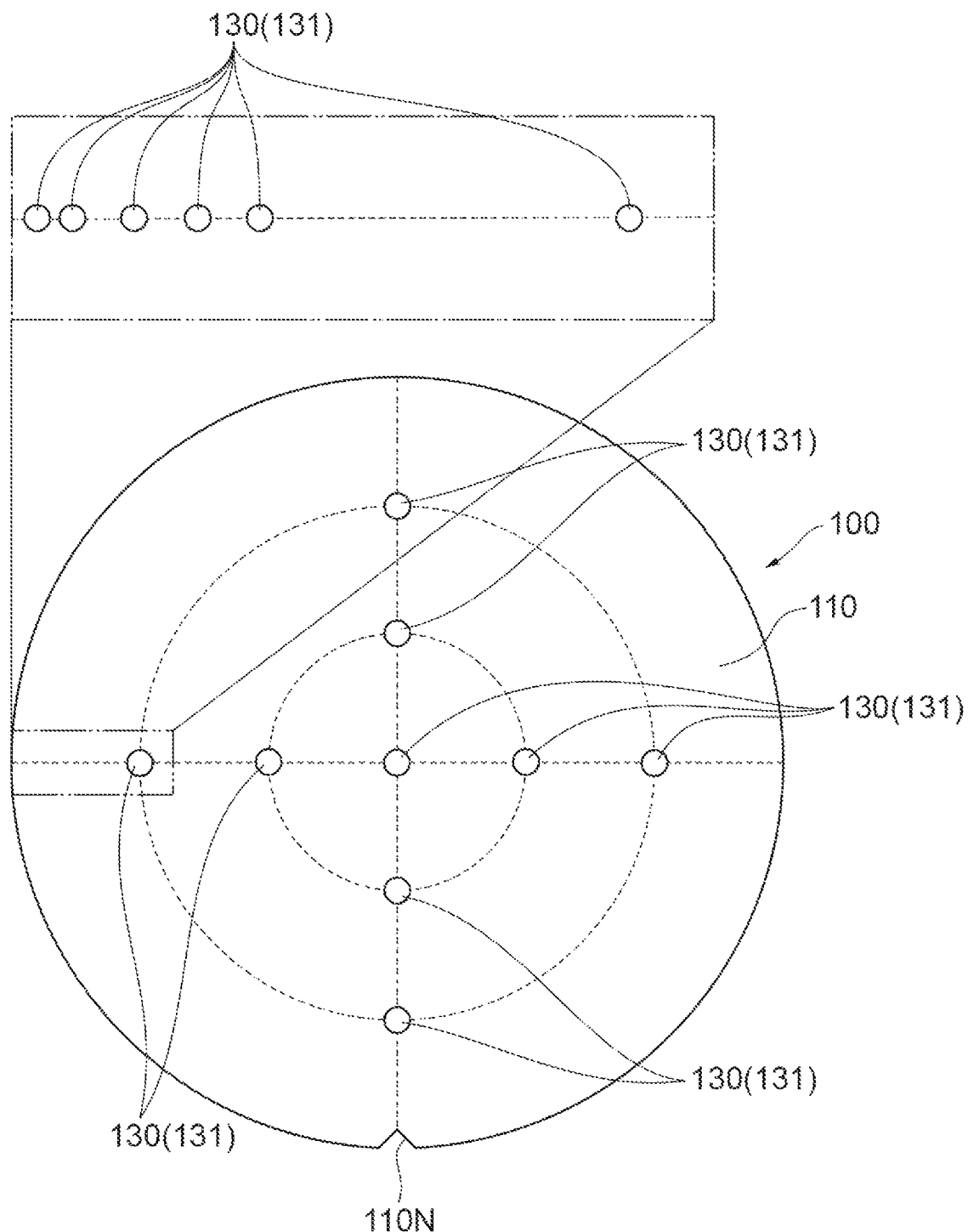
FIG. 4 is a plan view illustrating a monitoring device of an example when viewed from an upper surface side.
Figure 5:
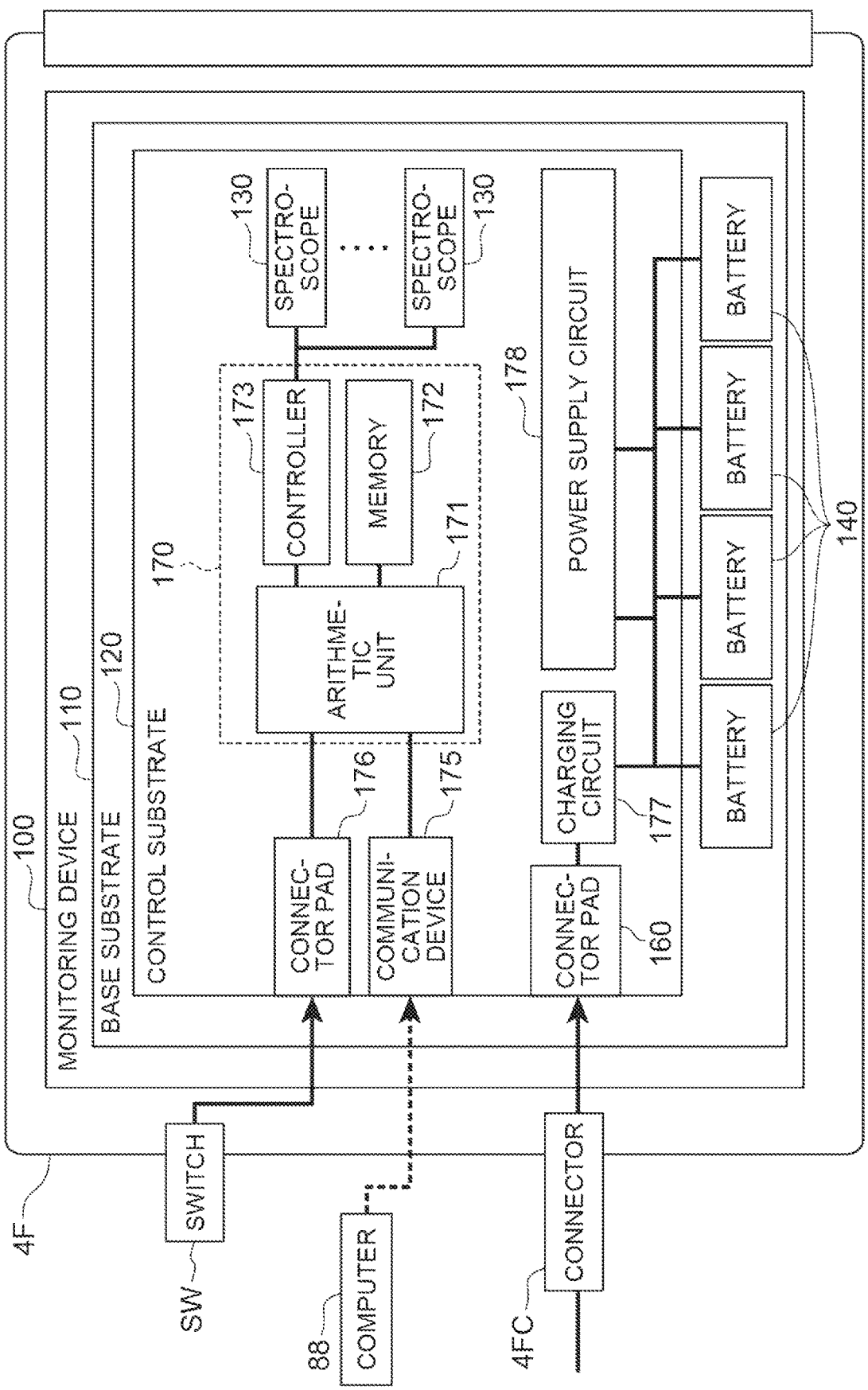
FIG. 5 is a block diagram illustrating a configuration of the monitoring device of the example.

FIG. 4 is a schematic plan view of the monitoring device 100 according to an example when viewed from an upper surface side. FIG. 5 is a block diagram illustrating the monitoring device 100 of the example. In FIG. 5, a dedicated FOUP 4F that is used when using the monitoring device 100 is also schematically illustrated. The FOUP 4F may be any of the containers 4a to 4d. The monitoring device 100 includes a base substrate 110, a control substrate 120, and a battery 140. The monitoring device 100 can be transported from the FOUP 4F onto the stage ST (that is, on the electrostatic chuck ESC) by the transport devices TU1 and TU2 of the processing system 1.

That is, the transport device TU1 takes out the monitoring device 100 from the FOUP 4F, and transports the monitoring device 100 to the aligner AN. Subsequently, the transport device TU1 takes out the monitoring device 100 having the adjusted position from the aligner AN, and transports the monitoring device 100 to one of the load lock module LL1 and the load lock module LL2. Next, the transport device TU2 of the transfer module TF takes out the monitoring device 100 from one of the load lock modules, and transports the monitoring device 100 onto the stage ST of any of the process modules PM1 to PM5.

The base substrate 110 may be a substrate using a disk-shaped wafer similar to the workpiece W as an example, so that the substrate can be transported by the transport devices TU1 and TU2 of the processing system 1. Meanwhile, the base substrate 110 is not limited to a disk shape, and may have any shape such as a polygon, an ellipse, or the like as long as it can be transported by the transport devices TU1 and TU2 that transport the workpiece W. A notch 110N is formed on an edge of the base substrate 110. Therefore, a rotation position of the monitoring device 100 when it is transported on the stage ST can be controlled constantly. As a material of the base substrate 110, for example, silicon, carbon fiber, quartz glass, silicon carbide, silicon nitride, alumina, and the like are used.

The control substrate 120 is a circuit substrate provided on an upper surface of the plate-shaped base substrate 110. The control substrate 120 includes a plurality of spectroscopes 130, a connector pad 160, and a control circuit 170.

The spectroscope 130 is a device for detecting light emission by a plasma generated in the chamber S. The spectroscope 130 includes a spectroscopic unit that separates incident light for each wavelength, and a detection unit that detects an intensity of the light of each wavelength dispersed by the spectroscopic unit. The detection unit may include, for example, an image sensor such as a complementary metal-oxide semiconductor (CMOS). The spectroscope 130 of an example converts the incident light into an electric signal according to the intensity of each wavelength, and acquires a light emission intensity for each wavelength based on the converted electric signal.

The spectroscope 130 can detect light in a predetermined measurement region in a direction of an optical axis of the spectroscope 130. The plurality of spectroscopes 130 have an optical axis facing upward on the base substrate 110 to acquire light from above the base substrate 110. The optical axis can be defined as an optical central axis of the spectroscope 130. The respective spectroscopes 130 are disposed apart from each other on the base substrate 110. The spectroscope 130 can monitor the plasma light emission generated in the chamber S in a state of being placed on the stage ST. In one example, the plurality of spectroscopes 130 may be disposed to be point-symmetrical on the base substrate 110 in a plan view. In addition, the plurality of spectroscopes 130 may be disposed to be line-symmetrical on the base substrate 110 in the plan view.

In one example, one of the spectroscopes 130 is disposed at a center of the base substrate 110, as illustrated in FIG. 4. In addition, the spectroscopes 130 are disposed at a plurality of positions in a radial direction of the base substrate 110. In addition, the spectroscopes 130 are disposed at equal intervals in a circumferential direction of the base substrate 110. In one example, on a peripheral edge side of the base substrate 110, the spectroscope 130 may be disposed to be denser in the radial direction than a center side. In the illustrated example, in the disk-shaped base substrate 110, the spectroscopes 130 are disposed at nine locations including the center along the radial direction. In addition, the spectroscopes 130 are disposed at four locations at 90° intervals in the circumferential direction at positions other than the center, respectively. That is, in the illustrated example, the twenty nine spectroscopes 130 are disposed on the base substrate 110. In a case where a diameter of the base substrate 110 is 300 mm, as an example, the spectroscopes 130 may be disposed at positions of 3 mm, 5 mm, 10 mm, 15 mm, 20 mm, 50 mm, 100 mm, and 150 mm (center) from the peripheral edge of the base substrate 110.

For example, the optical axis of each of the spectroscopes 130 is substantially orthogonal to the upper surface of the planar base substrate 110. The optical axis may intersect a plane of the base substrate 110 obliquely. In addition, the spectroscope 130 has a translucent cover 131 for protecting the inside from the plasma generated inside the plasma processing apparatus 10. The cover 131 may be formed of, for example, a material such as sapphire.

Figure 6:
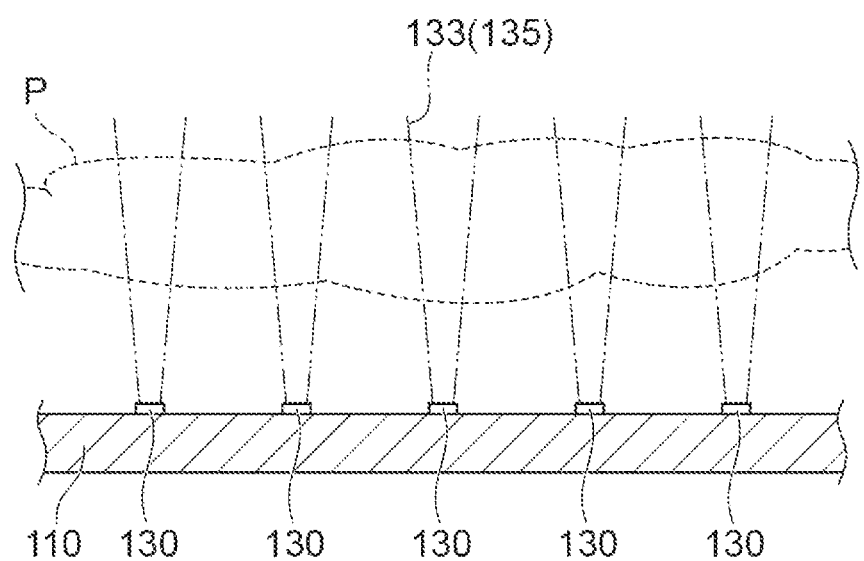
FIG. 6 is a schematic diagram for explaining an imaging range of a spectroscope of the monitoring device of the example.

FIG. 6 is a diagram for explaining a measurement region 135 of the spectroscope 130 of the monitoring device 100 of an example, and illustrates the measurement regions 135 of the plurality of spectroscopes 130 when viewed from a side. In FIG. 6, the measurement regions 135 of the five spectroscopes are schematically illustrated for easy understanding. The measurement region 135 is a region of a space that can be measured by each of the spectroscopes 130. The measurement region 135 of the example may be a region within a range of a detection angle 133 of the spectroscope 130. The detection angle 133 is inclined at a predetermined angle with an optical axis of the spectroscope 130 as a center. That is, the measurement region 135 has a substantially conical shape.

Each of the spectroscopes 130 detects light from a plasma P existing inside the corresponding measurement region 135. In a state in which the monitoring device 100 is placed on the stage ST in the chamber body 12, the measurement region 135 of each of the plurality of spectroscopes 130 may be a region including immediately above each of the spectroscopes 130. In one example, the measurement region 135 of each of the plurality of spectroscopes 130 does not include regions that overlap with each other. That is, the respective measurement regions 135 of the plurality of spectroscopes 130 may be independent regions separated (apart) from each other.

The connector pad 160 is a connection portion for charging the battery 140, and can be connected to an external power supply. The connector pad 160 is connected to the external power supply via the connector 4FC provided in the dedicated FOUP 4F, in a state in which the monitoring device 100 is placed in the dedicated FOUP 4F. A plurality of batteries 140 (four in the illustrated example) are arranged in the base substrate 110. The battery 140 supplies power to the spectroscope 130 and the control circuit 170. As illustrated in FIG. 5, a charging circuit 177 is connected between the connector pad 160 and the battery 140, and charging of the battery 140 is controlled by the charging circuit 177. In addition, a power supply circuit 178 is connected to the battery 140, and the power from the battery 140 is supplied to each device via the power supply circuit 178.

The control circuit 170 is disposed at the control substrate 120. The control circuit 170 includes an arithmetic unit 171 including a processor, a memory 172, a controller 173, and the like, and comprehensively controls the operation of the monitoring device 100 based on a program stored in the memory 172. The control circuit 170 functions as a controller that controls each portion of the monitoring device 100. For example, measurement by the spectroscope 130 is controlled by the controller 173. In addition, a communication device 175 is connected to the control circuit 170 to control the communication with other external devices. In one example, the communication device 175 is used to connect to the external computer 88. Any of a wired or wireless method may be used as a method of connection between the communication device 175 and the computer 88. In addition, in one example, the monitoring device 100 includes a connector pad 176 connected to the control circuit 170. The connector pad 176 is connected to a switch SW provided on the dedicated FOUP 4F. The control circuit 170 can start controlling the monitoring device 100 based on a signal input from the switch SW. In one example, the switch SW and the controller MC may be communicably connected, and the controller MC may start the control on the processing system 1 based on the signal input from the switch SW.

In one example, the controller 173 causes the spectroscope 130 to execute measurement when a plasma is generated in the chamber body 12 in a state in which the monitoring device 100 is placed on the stage ST. Measurement data of the plasma monitored by the spectroscope 130 can be stored in the memory 172, for example. The measurement data may be light emission intensity data for each wavelength of the plasma light emission incident on the spectroscope 130. In this case, the measurement data is generated for each spectroscope 130. The measurement data may be a light emission intensity for each wavelength acquired in a time series. After the measurement is ended, the measurement data stored in the memory 172 is transmitted to the computer 88 connected to the communication device 175. The computer 88 (control device) acquires (generates) light emission intensity distribution data of the plasma generated in the chamber S, based on the measurement data indicating the light emission intensity acquired by the plurality of spectroscopes 130.

The light emission intensity distribution data may be a data group of light emission intensities associated with the respective spectroscopes 130. That is, the light emission intensity distribution data is data indicating the light emission intensity in the measurement region of each spectroscope 130, and can indicate a light emission intensity distribution of the plasma generated in the chamber S. For example, the computer 88 acquires the light emission intensity for each wavelength in each of the spectroscopes 130 in a time series. Therefore, the computer 88 can output the light emission intensity of any wavelength in a time series corresponding to each of the spectroscopes 130. Further, the computer 88 can output a distribution of the light emission intensity of any wavelength at any time.

The computer 88 of an example may output, as light emission intensity distribution data, visible display data in which the light emission intensity of each of the plurality of spectroscopes 130 is displayed corresponding to respective positions of the plurality of spectroscopes 130 in the monitoring device 100.

Figure 7:
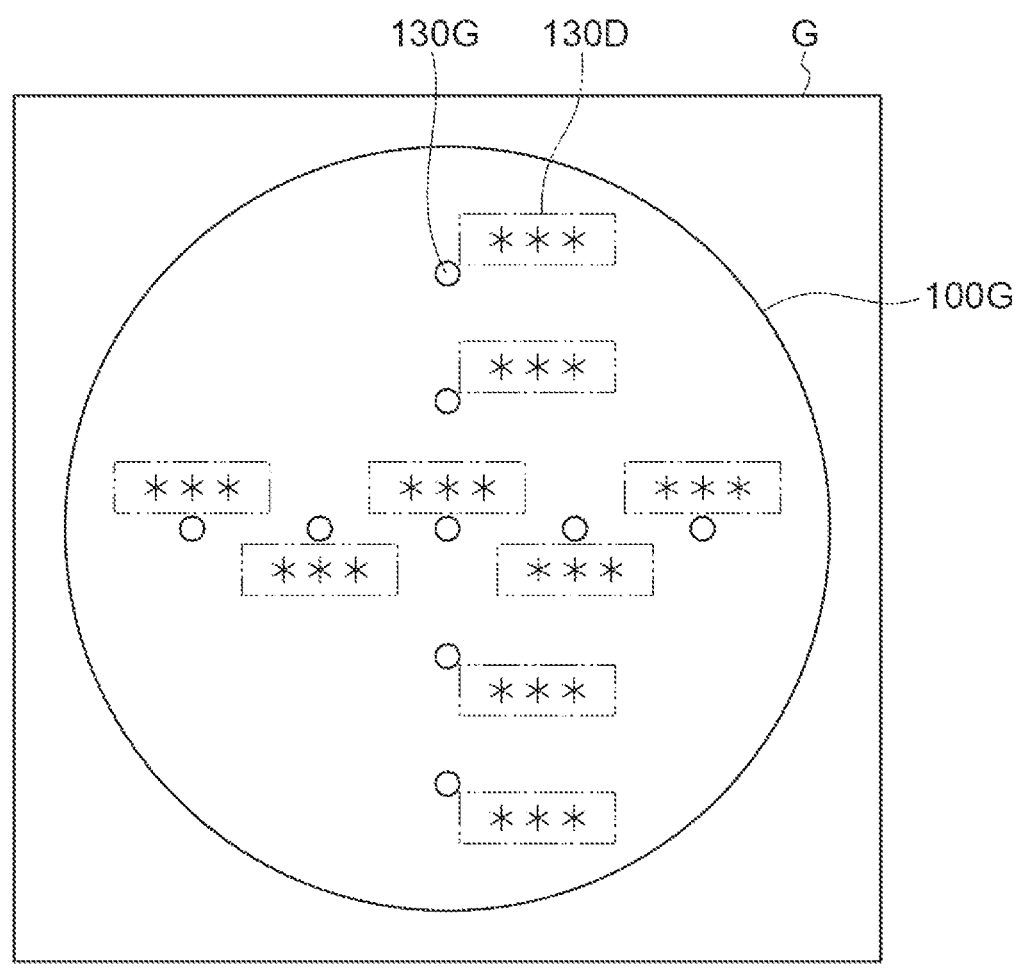
FIG. 7 is a diagram schematically illustrating an example of a composite image based on an image captured by the spectroscope.

For example, the visible display data may be data for superimposing the light emission intensity acquired by the plurality of spectroscopes 130 on an image schematically illustrating the monitoring device 100 and displaying the resultant image. FIG. 7 is a diagram schematically illustrating an example of the visible display data. In FIG. 7, for convenience of description, a display image G based on the nine spectroscopes is schematically illustrated. In the display image G illustrated in FIG. 7, an image 100G schematically illustrating a borderline of the monitoring device 100 is illustrated. In the image 100G, a circular display 130G indicating a position of the spectroscope 130 on the base substrate 110 is illustrated inside the borderline indicating the monitoring device 100. In the display image G, a display 130D indicating a light emission intensity acquired by the corresponding spectroscope 130 is illustrated adjacent to each display 130G. In FIG. 7, the display 130D of the light emission intensity is illustrated as "***", and the display 130D is actually indicated by a numerical value. The computer 88 may generate visible display data at any wavelength as time series data. In this case, the computer 88 can visually display a light emission intensity distribution at a wavelength λnm at a point of a lapse of N seconds from a start of measurement.

Figure 8:
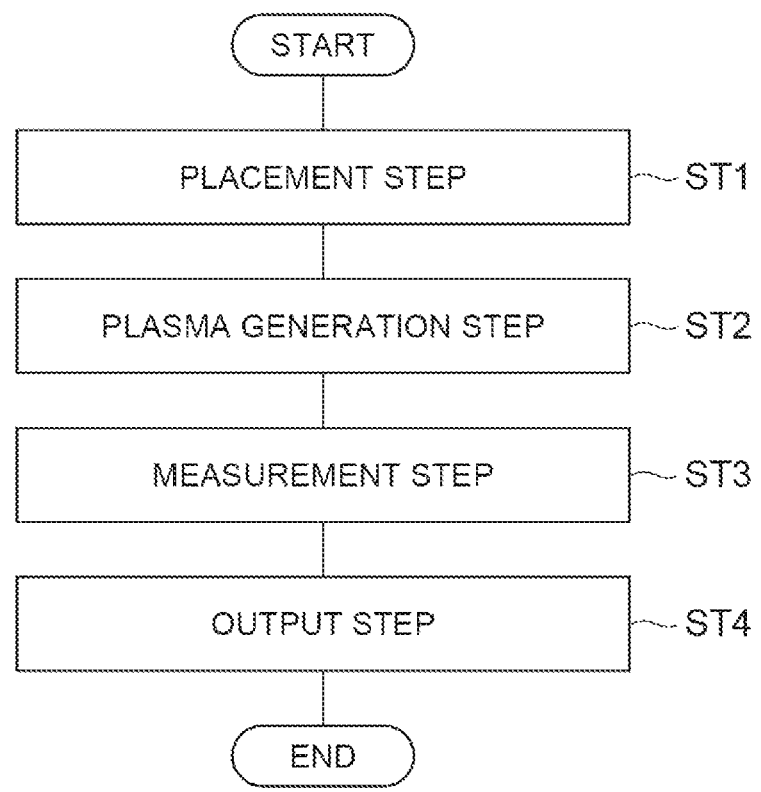
FIG. 8 is a flowchart illustrating an example of an operation method of the monitoring device.

Subsequently, a monitoring method for measuring plasma light emission using the monitoring device 100 will be described. FIG. 8 is a flowchart illustrating an example of the monitoring method. As illustrated in FIG. 8, in the example of the monitoring method, the monitoring device 100 is transported into the plasma processing apparatus 10 (process module PM) as a monitoring target by the transport devices TU1 and TU2 (placement step: step ST1). In a case of operating the monitoring device 100, first, the monitoring device 100 placed inside the dedicated FOUP 4F is activated. As described above, since the dedicated FOUP 4F is provided with the switch SW for activating the monitoring device 100, the switch SW enables the monitoring device 100 to be activated. In a case of monitoring a plasma generated in the chamber S by using the monitoring device 100, first, the monitoring device 100 is activated by the switch SW. The monitoring device 100 may be stored in a stocker 3 capable of depressurizing, which is connected to the transport device TU2 in a depressurized environment, and may be transported from the stocker 3 to the plasma processing apparatus 10. In the example illustrated in FIG. 1, for example, the stocker 3 is disposed with the process modules PM1 to PM5. The monitoring device 100 may be transported from the stocker 3 to the plasma processing apparatus 10 by the transport device TU2. The stocker 3 may have the switch SW or the like, in the same manner as the FOUP 4F.

In a case where the switch SW is operated, a signal from the switch SW is also output to the controller MC. The controller MC, to which the signal from the switch SW is input, controls the processing system 1 such that the transport devices TU1 and TU2 transport the monitoring device 100 from the FOUP 4F to the stage ST inside the process module PM. In one example, the controller MC transports the monitoring device 100 onto the electrostatic chuck ESC, and then supplies a gas to the chamber S and applies a radio frequency to the upper electrode 30 and the lower electrode LE to generate a plasma over a certain time (plasma generation step: step ST2).

Subsequently, light of the plasma generated in the chamber S is measured by the spectroscope 130 (measurement step: step ST3). The controller 173 controls the spectroscope 130 such that the measurement by the spectroscope 130 is started after the monitoring device 100 is transported onto the electrostatic chuck ESC. For example, the controller 173 may start the measurement by the spectroscope 130 when a predetermined time elapses since the signal of the switch SW is input. The measurement by the spectroscope 130 can be executed over a preset time. For example, in a case where a plasma is generated in the chamber S for a certain time, the measurement by the spectroscope 130 can be executed over a time from a start to an end of plasma generation.

The controller MC controls the processing system 1 such that the transport devices TU1 and TU2 transport the monitoring device 100 from the stage ST to the FOUP 4F after the measurement by the spectroscope 130 is ended. That is, the transport device TU2 takes out the monitoring device 100 from the process module, and transports the monitoring device 100 to one of the load lock module LL1 and the load lock module LL2. Next, the transport device TU1 takes out the monitoring device 100 from one of the load lock modules, and transports the monitoring device 100 to the FOUP 4F. For example, in a case where a predetermined time elapses after the monitoring device 100 is transported onto the stage ST, the controller MC may determine that the measurement by the monitoring device 100 is ended.

Subsequently, light emission intensity distribution data of the plasma is output (output step: step ST4). In one example, when the monitoring device 100 returns to the FOUP 4F, measurement data stored in the memory 172 of the monitoring device 100 is transmitted to the computer 88. The computer 88 outputs the light emission intensity distribution data of the plasma based on the acquired measurement data.

In one example, the computer 88 outputs visible display data as the light emission intensity distribution data of the plasma.

As described above, in one exemplary embodiment, a system for measuring a light emission intensity of the plasma P generated in the plasma processing apparatus 10 is provided. This system includes the monitoring device 100. The monitoring device 100 is a device to be placed on the stage ST in the plasma processing apparatus 10. The monitoring device 100 includes the plate-shaped base substrate 110, and the plurality of spectroscopes 130 having optical axes facing upward on the base substrate 110 and being disposed apart from each other to acquire light emission intensities of the plasma P. In this system, light emission intensity distribution data of the plasma in the plasma processing apparatus 10 is acquired based on the light emission intensity acquired by each of the plurality of spectroscopes 130.

In one exemplary embodiment, a method of measuring a light emission intensity of a plasma generated in the plasma processing apparatus 10 by using the monitoring device 100 is provided. The method includes a step of placing the monitoring device 100 on the stage ST in the chamber S of the plasma processing apparatus 10. The method includes a step of generating a plasma in the chamber S of the plasma processing apparatus 10. The method includes a step of acquiring light emission intensities of the plasma by the plurality of spectroscopes 130. The method includes a step of acquiring light emission intensity distribution data of the plasma in the plasma processing apparatus 10 based on the light emission intensities acquired by the plurality of spectroscopes 130.

With the exemplary embodiment described above, the light emission intensity of the plasma generated in the plasma processing apparatus 10 is acquired by the plurality of spectroscopes 130 of the monitoring device 100 placed on the stage ST. The plurality of spectroscopes 130 are disposed apart from each other on the base substrate 110. Therefore, the measurement regions 135 for light in each of the spectroscopes 130 are different from each other. That is, each of the spectroscopes 130 can acquire the light emission intensity of the plasma in different regions in the plasma processing apparatus 10. Therefore, it is possible to acquire light emission intensity distribution data of the plasma in the plasma processing apparatus 10 based on the light emission intensities of the plasma acquired by the plurality of spectroscopes 130.

In one exemplary embodiment, the light emission intensity distribution data is visible display data in which the light emission intensity acquired by each of the plurality of spectroscopes 130 corresponding to each position of the plurality of spectroscopes 130 in the monitoring device 100 is displayed. With such a configuration, since a relationship between the position of each spectroscope 130 and the light emission intensity can be easily understood, a distribution of the light emission intensity in the plasma processing apparatus can be intuitively and easily grasped.

In one exemplary embodiment, the measurement region 135 for each light of the plurality of spectroscopes 130 in the plasma processing apparatus 10 does not include an overlapping region. With this configuration, it is possible to clearly separate the light emission intensity of the plasma generated in the plasma processing apparatus 10 for each position. That is, characteristics of plasma light emission for each position are easily reflected in the light emission intensity distribution data.

Although various exemplary embodiments are described above, without being limited to the exemplary embodiments described above, various omissions, substitutions, and changes may be made.

A capacitively-coupled plasma processing apparatus is described as the plasma processing apparatus, and a form of the plasma processing apparatus is not limited to this example. For example, the plasma processing apparatus may be an inductively-coupled plasma processing apparatus. Further, the plasma processing apparatus may be a plasma processing apparatus that generates a plasma by using surface waves such as microwaves.

The example in which the spectroscopes are evenly disposed in the circumferential direction at the predetermined positions in the radial direction on the base substrate is described, and the arrangement mode of the spectroscopes is not limited to this example. For example, the number of spectroscopes to be disposed in the circumferential direction may be increased as a distance from the center is increased in the radial direction. In addition, the spectroscopes may be evenly disposed in the X-direction and the Y-direction with the base substrate as the XY plane such that the spectroscopes are disposed in a lattice pattern.

The example in which the measurement data acquired by the monitoring device is transmitted to the computer 88 after the end of the measurement is described. Meanwhile, the measurement data may be transmitted to the computer 88 in real time by wireless communication or the like when the measurement is executed by the spectroscope 130, for example. In this case, the computer 88 may generate the light emission intensity distribution data in real time. In addition, the measurement data may be transmitted to the computer 88 by wireless communication or the like when the transport devices TU1 and TU2 transport the monitoring device 100 from the stage ST to the FOUP 4F after the measurement by the monitoring device 100 is ended. In addition, for example, a transmission unit may be provided in the monitoring device 100, a reception unit may be provided in the stage ST, and the measurement data stored in the memory 172 of the monitoring device 100 may be transmitted from the transmission unit of the monitoring device 100 to the reception unit of the stage ST by a wired or wireless manner. In this case, the reception unit of the stage ST may be connected to an external computer.

Although the example of generating the light emission intensity distribution data by the computer 88 based on the measurement data measured by the spectroscope 130 is described, for example, the light emission intensity distribution data may be generated by the arithmetic unit 171 of the monitoring device 100.

From the above description, it will be understood that various embodiments of the present disclosure have been described herein, and that various modifications may be made without departing from the scope and spirit of the present disclosure. Accordingly, the various embodiments disclosed herein are not intended to be limiting, with the true scope and spirit being indicated by the aspects following claims.

What is claimed is:

1. A plasma monitoring system for measuring a light emission intensity of a plasma generated in a plasma processing apparatus, the system comprising:
a monitoring device to be placed on a stage in the plasma processing apparatus, the monitoring device including a plate-shaped base substrate, and a plurality of spectroscopes having optical axes facing upward on the base substrate, and being disposed apart from each other to acquire light emission intensities of the plasma; and
a control device for acquiring light emission intensity distribution data of the plasma in the plasma processing apparatus based on the light emission intensity acquired by each of the plurality of spectroscopes.

2. The plasma monitoring system according to claim 1, wherein the light emission intensity distribution data is visible display data in which the light emission intensity acquired by each of the plurality of spectroscopes corresponding to each position of the plurality of spectroscopes in the monitoring device is displayed.

3. The plasma monitoring system according to claim 1, wherein a measurement region of light of each of the plurality of spectroscopes in the plasma processing apparatus does not include an overlapping region.

4. The plasma monitoring system according to claim 1, wherein the plurality of spectroscopes are disposed on the base substrate in a point-symmetrical manner in a plan view.

5. The plasma monitoring system according to claim 1, wherein the plurality of spectroscopes are disposed on the base substrate in a line-symmetrical manner in a plan view.

6. The plasma monitoring system according to claim 1, wherein the plurality of spectroscopes are disposed at a plurality of positions in a radial direction of the base substrate.

7. The plasma monitoring system according to claim 1, wherein the plurality of spectroscopes are disposed more densely in a radial direction on a peripheral side of the base substrate than on a center side.

8. The plasma monitoring system according to claim 1, wherein the plurality of spectroscopes are covered with a sapphire cover.

9. A plasma monitoring method of measuring a light emission intensity of a plasma generated in a plasma processing apparatus by using a monitoring device,
in which the monitoring device includes
a plate-shaped base substrate, and
a plurality of spectroscopes having optical axes facing upward on the base substrate, and being disposed apart from each other, and
the method comprising:
placing the monitoring device on a stage in a chamber of the plasma processing apparatus;
generating a plasma in the chamber of the plasma processing apparatus;
acquiring light emission intensities of the plasma by the plurality of spectroscopes; and
acquiring light emission intensity distribution data of the plasma in the plasma processing apparatus based on the light emission intensities acquired by the plurality of spectroscopes.

10. The plasma monitoring method according to claim 9, wherein the light emission intensities are data acquired for each wavelength of the plasma.

11. The plasma monitoring method according to claim 9, wherein the light emission intensities are data acquired in a time series for each wavelength of the plasma.

12. The plasma monitoring method according to claim 9, wherein the light emission intensity distribution data is a distribution of the light emission intensity for any wavelength at any time.

13. A monitoring device for measuring a light emission intensity of a plasma generated in a plasma processing apparatus, the device comprising:
- a plate-shaped base substrate placed on a stage in the plasma processing apparatus;
- a plurality of spectroscopes having optical axes facing upward on the base substrate, and being disposed apart from each other to acquire light emission intensities of the plasma; and
- a control device for acquiring light emission intensity distribution data of the plasma in the plasma processing apparatus based on the light emission intensity acquired by each of the plurality of spectroscopes.

14. The plasma monitoring device according to claim 13, wherein the plurality of spectroscopes are disposed on the base substrate in a point-symmetrical manner in a plan view.

15. The plasma monitoring device according to claim 13, wherein the plurality of spectroscopes are disposed on the base substrate in a line-symmetrical manner in a plan view.

16. The plasma monitoring device according to claim 7, wherein the plurality of spectroscopes are disposed at a plurality of positions in a radial direction of the base substrate.

17. The plasma monitoring device according to claim 13, wherein the plurality of spectroscopes are disposed more densely in a radial direction on a peripheral side of the base substrate than on a center side.

18. The plasma monitoring device according to claim 13, wherein the plurality of spectroscopes are covered with a sapphire cover.

* * * * *